(12) United States Patent
Stevens et al.

(10) Patent No.: US 6,977,014 B1
(45) Date of Patent: *Dec. 20, 2005

(54) ARCHITECTURE FOR HIGH THROUGHPUT SEMICONDUCTOR PROCESSING APPLICATIONS

(75) Inventors: Craig L. Stevens, Ben Lomond, CA (US); Karl B. Levy, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/872,796

(22) Filed: Jun. 1, 2001

Related U.S. Application Data

(60) Provisional application No. 60/209,079, filed on Jun. 2, 2000.

(51) Int. Cl.[7] .................. C23C 16/00; B65G 49/07
(52) U.S. Cl. .................. 118/719; 414/939; 414/941
(58) Field of Search .................. 414/217, 935–941; 118/719; 29/25.01

(56) References Cited

U.S. PATENT DOCUMENTS

| | | |
|---|---|---|
| 3,202,406 A | 8/1965 | Tack |
| 4,042,128 A | 8/1977 | Shrader .................. 214/17 B |
| 4,220,899 A | 9/1980 | Von Der Heide |
| 4,228,358 A | 10/1980 | Ryding .................. 250/457 |
| 4,560,911 A | 12/1985 | Chitayat |
| 4,604,020 A | 8/1986 | Toro Lira et al. |
| 4,604,027 A | 8/1986 | Becker et al. |
| 4,619,573 A | 10/1986 | Rathman et al. |
| 4,705,951 A | 11/1987 | Layman et al. .......... 250/442.1 |
| 4,795,299 A | 1/1989 | Boys et al. .................. 414/217 |
| 4,851,101 A | 7/1989 | Hutchinson .................. 204/298 |
| 4,917,556 A | 4/1990 | Stark et al. .................. 414/217 |
| 4,923,584 A | 5/1990 | Bramhall, Jr. et al. |
| 4,927,484 A | 5/1990 | Mitomi |
| 5,135,608 A | 8/1992 | Okutani .................. 156/643 |
| 5,186,594 A | 2/1993 | Toshima et al. .......... 414/217 |
| 5,186,718 A | 2/1993 | Tepman et al. .......... 29/25.01 |
| 5,199,483 A * | 4/1993 | Bahng .................. 165/80.1 |

(Continued)

FOREIGN PATENT DOCUMENTS

FR    2 766 028 A1    1/1999

(Continued)

OTHER PUBLICATIONS

John F. O'Hanlon, et al: "Reduction of water aerosol contamination during pumping of a vacuum chamber from atmospheric pressure" *American Vacuum Society*, J. Vac. Sci.Technol. A 9 (5); Sep./Oct. 1991, pp. 2802-2807.

(Continued)

*Primary Examiner*—Erik Kielin
(74) *Attorney, Agent, or Firm*—Okamoto & Benedicto LLP

(57) ABSTRACT

A semiconductor wafer processing system in accordance with an embodiment of the present invention includes a loading station, a load lock, a process module, an intermediate process module, and a transport module which further includes a load chamber, a transfer chamber, and a pass-through chamber between the load chamber and the transfer chamber. The intermediate process module may be coupled to the load chamber, or both the load chamber and the transfer chamber. In one embodiment, the load lock is a single-wafer load lock capable of accommodating only a single wafer at a time to allow for fast pump down and vent cycles. In one embodiment, the pass-through chamber is configured as a cooling station to improve throughput for processes that require the wafer to be cooled in-between depositions, for example.

16 Claims, 15 Drawing Sheets

U.S. PATENT DOCUMENTS

| | | | |
|---|---|---|---|
| 5,229,669 A | | 7/1993 | Takei |
| 5,281,320 A | * | 1/1994 | Turner et al. .......... 204/298.15 |
| 5,314,541 A | | 5/1994 | Saito et al. ................. 118/725 |
| 5,330,633 A | | 7/1994 | Matsumoto |
| 5,344,542 A | | 9/1994 | Maher et al. |
| 5,512,320 A | | 4/1996 | Turner et al. ................ 427/255 |
| 5,518,542 A | | 5/1996 | Matsukawa et al. .......... 118/52 |
| 5,674,368 A | | 10/1997 | Hashimoto |
| 5,676,590 A | | 10/1997 | Hiraoka ...................... 451/287 |
| 5,753,133 A | | 5/1998 | Wong et al. ................... 216/67 |
| 5,789,878 A | * | 8/1998 | Kroeker et al. ............... 318/45 |
| 5,833,426 A | | 11/1998 | Marohl |
| 5,876,556 A | | 3/1999 | Takanami |
| 5,882,165 A | | 3/1999 | Maydan et al. ............. 414/217 |
| 5,902,088 A | | 5/1999 | Fairbairn et al. ............ 414/217 |
| 5,944,857 A | * | 8/1999 | Edwards et al. ............ 29/25.01 |
| 5,951,770 A | | 9/1999 | Perlov et al. ................ 118/719 |
| 5,961,722 A | | 10/1999 | Buhrer et al. ............... 118/712 |
| 6,007,675 A | | 12/1999 | Toshima ...................... 156/345 |
| 6,048,154 A | | 4/2000 | Wytman ....................... 414/217 |
| 6,251,759 B1 | * | 6/2001 | Guo et al. ................... 438/584 |
| 6,270,582 B1 | * | 8/2001 | Rivkin et al. ............... 118/719 |
| 6,271,606 B1 | | 8/2001 | Hazelton |
| 6,305,895 B1 | | 10/2001 | Ozawa |
| 6,431,807 B1 | * | 8/2002 | Stevens et al. ............. 414/217 |
| 6,722,835 B1 | * | 4/2004 | Stevens et al. ............. 414/217 |
| 2001/0041122 A1 | * | 11/2001 | Kroeker ...................... 414/217 |
| 2002/0031420 A1 | | 3/2002 | Kroeker |
| 2002/0033136 A1 | | 3/2002 | Savage et al. |

FOREIGN PATENT DOCUMENTS

| | | |
|---|---|---|
| JP | 410178083 A | 6/1998 |

OTHER PUBLICATIONS

"Operator's Handbook", MB2 Modular Sputtering System, Varian Semiconductor Equipment, TFS Technical Publications, Oct. 1994.

"Drawings & Schematics Manual" Backbone vol. 1, MB 2 Modular Sputtering System, Varian Semiconductor Equipment, TFS Technical Publications, Jun. 1996.

Various Engineering Drawings, Published as early as Oct. 1993, Varian Semiconductor Processing System, Varian Associates, Palo Alto, California.

* cited by examiner

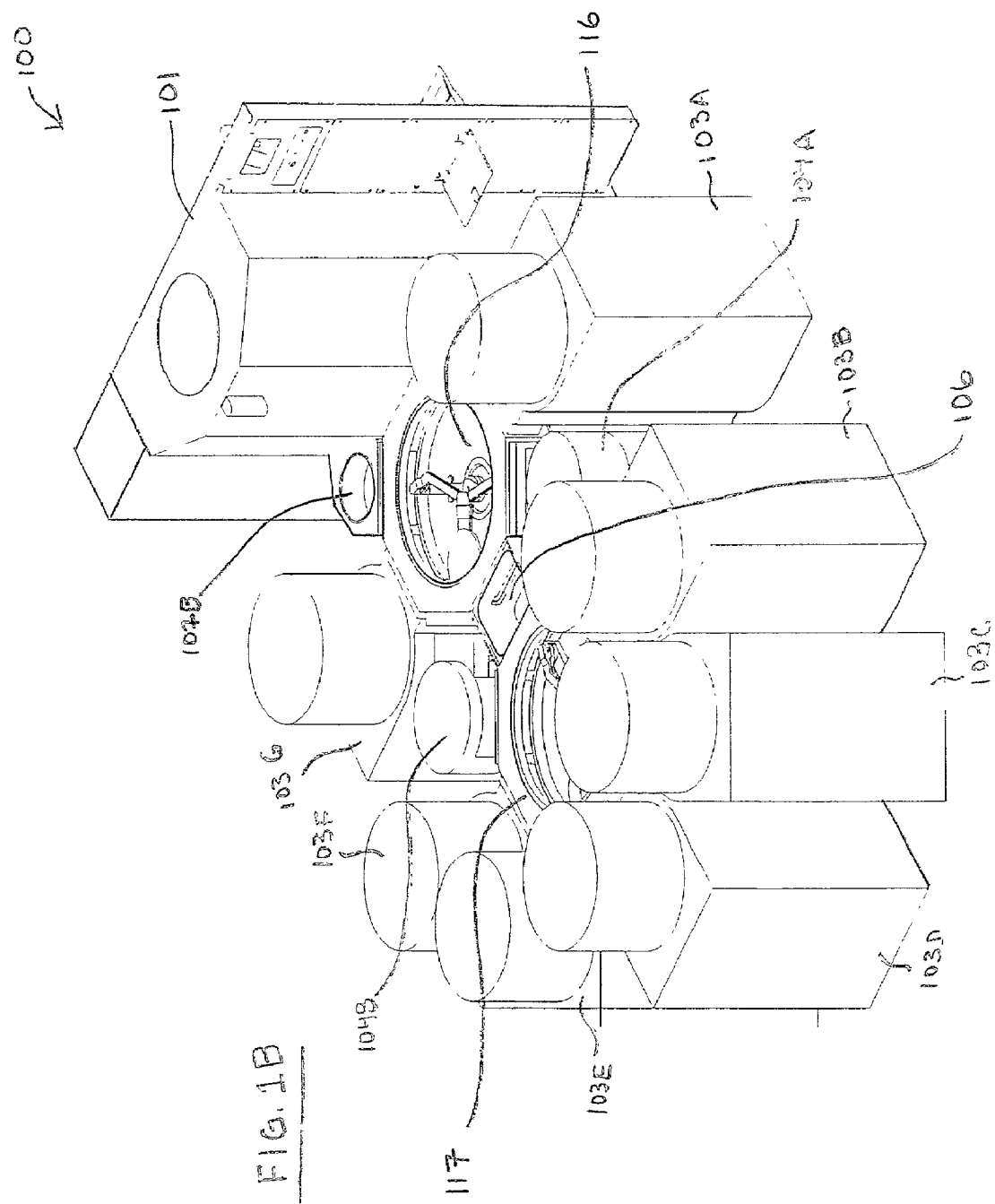

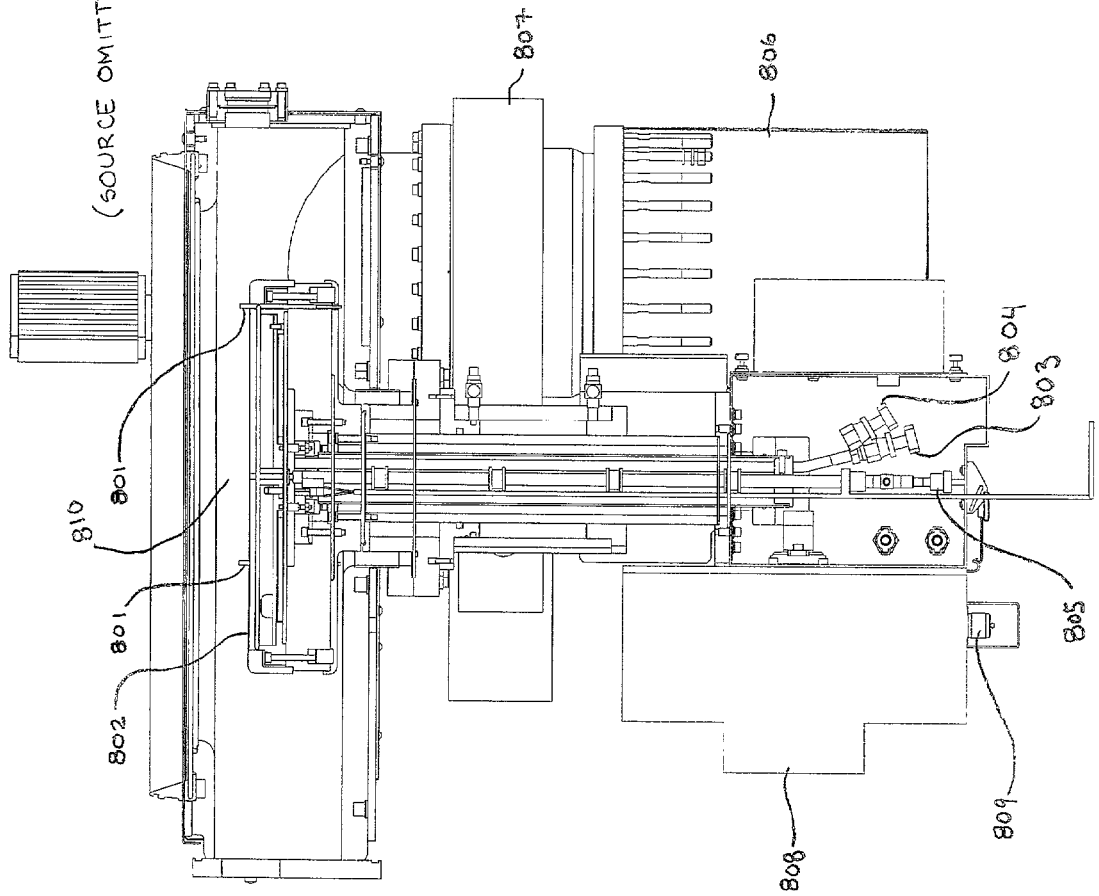

ARCHITECTURE FOR HIGH THROUGHPUT SEMICONDUCTOR PROCESSING APPLICATIONS

CROSS-REFERENCE TO RELATED APPLICATION

This application claims the benefit of and incorporates by reference U.S. Provisional Application No. 60/209,079, entitled "Wafer Transport And Processing System Architecture For High Throughput," filed on Jun. 2, 2000, by Craig L. Stevens and Karl B. Levy.

BACKGROUND OF THE INVENTION

1. Field of the Invention

The present invention relates generally to semiconductor device fabrication, and more particularly to semiconductor wafer processing systems.

2. Description of the Background Art

Semiconductor wafer processing systems that have more than one module are referred to as "cluster tools." Typically, a cluster tool has a load lock module for receiving a semiconductor wafer, one or more process modules for performing fabrication steps on the wafer, and a transport module for moving the wafer from the load lock module to a process module, and vice versa. Exemplary cluster tools are disclosed in U.S. Pat. No. 4,917,556 to Stark et al. and U.S. Pat. No. 5,186,718 to Tepman et al., both of which are incorporated herein by reference in their entirety.

The arrangement of modules in a semiconductor wafer processing system (i.e., the system's architecture) directly affects throughput. Throughput is an important performance measure of a semiconductor wafer processing system because it is related to productivity the higher the throughput, the more wafers that can be processed within a given amount of time. Accordingly, the cost of ownership of a semiconductor wafer processing system and the fabrication cost per wafer depend on throughput.

SUMMARY

The present invention relates to a method, system, and associated apparatus for high throughput semiconductor processing applications. The invention may be used in a wide variety of semiconductor processing applications including physical vapor deposition (PVD), chemical vapor deposition (CVD), etching, etc.

A semiconductor wafer processing system in accordance with an embodiment of the present invention includes a loading station, a load lock, a process module, an intermediate process module, and a transport module which further includes a load chamber, a transfer chamber, and a pass-through chamber between the load chamber and the transfer chamber. The intermediate process module is coupled to the load chamber; in one embodiment, the intermediate process module is also coupled to the transfer chamber.

In one embodiment, the load lock is a single-wafer load lock capable of accommodating only a single wafer at a time, and correspondingly has a small volume which results in fast pump down and vent cycles.

In one embodiment, the load lock is capable of cooling a wafer during a vent cycle. This eliminates the need to cool the wafer in a separate cooling station prior to returning the wafer to its cassette on the loading station.

In one embodiment, the pass-through chamber is configured as a cooling station. For processes requiring the wafer to be cooled in-between depositions, the use of the pass-through chamber as a cooling station improves throughput by allowing the wafer to be cooled while it is in transit from a process module coupled to the transfer chamber to a process module coupled to the load chamber, for example.

These and other features and advantages of the present invention will be readily apparent to persons of ordinary skill in the art upon reading the entirety of this disclosure, which includes the accompanying drawings and claims.

BRIEF DESCRIPTION OF THE DRAWINGS

FIGS. 1A and 1B show perspective views of a semiconductor wafer processing system in accordance with an embodiment of the present invention.

FIG. 8 shows a cross-sectional view of a process module configured for pre-clean in accordance with an embodiment of the present invention.

DETAILED DESCRIPTION

Figure 1A:
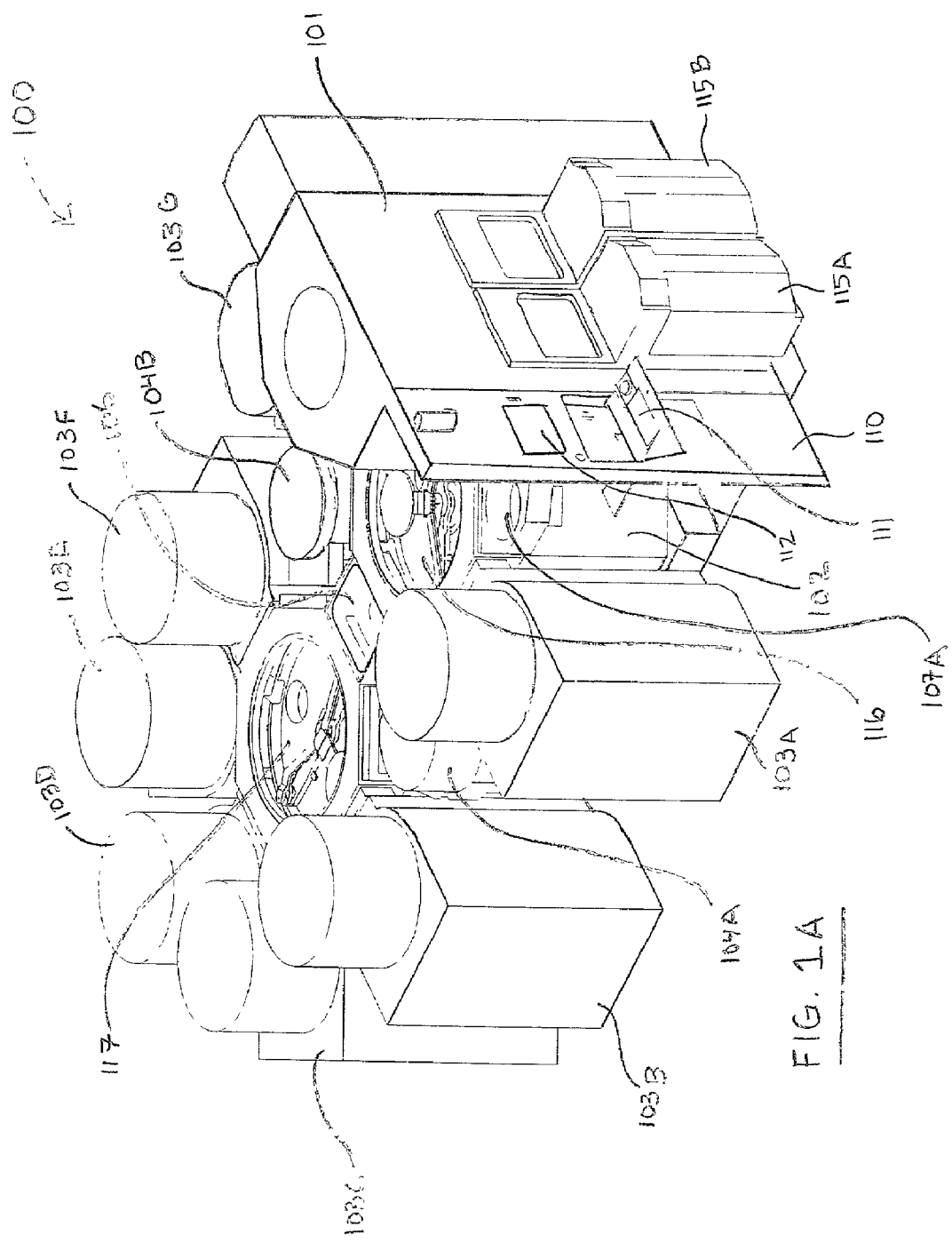

FIGS. 1A and 1B show perspective views of a semiconductor wafer processing system 100 in accordance with an embodiment of the present invention. Referring to FIG. 1A, system 100 includes a front-end module 101 for interfacing with fabrication personnel or factory automation systems, intermediate process modules 104 (i.e., 104A, 104B) and process modules 103 (i.e., 103A, 103B, 103C, 103D, 103E, 103F, 103G) for performing fabrication processing steps on wafers, and a transport module 102 for moving wafers between front end module 101 and other modules of system 100. In one embodiment, system 100 is of the same type as the INOVA XT 300 mm wafer processing system of Novellus Systems, Inc. of San Jose, Calif.

Typically, front-end module 101 is exposed to a clean room area of a semiconductor device fabrication facility, with the rest of system 100 extending into a maintenance area. In the present embodiment, front-end module 101 protrudes out of a wall separating the clean room area and the maintenance area. The entirety of system 100 may also be located in a single area, such as in a "ball room" configuration, for example.

Figure 2:
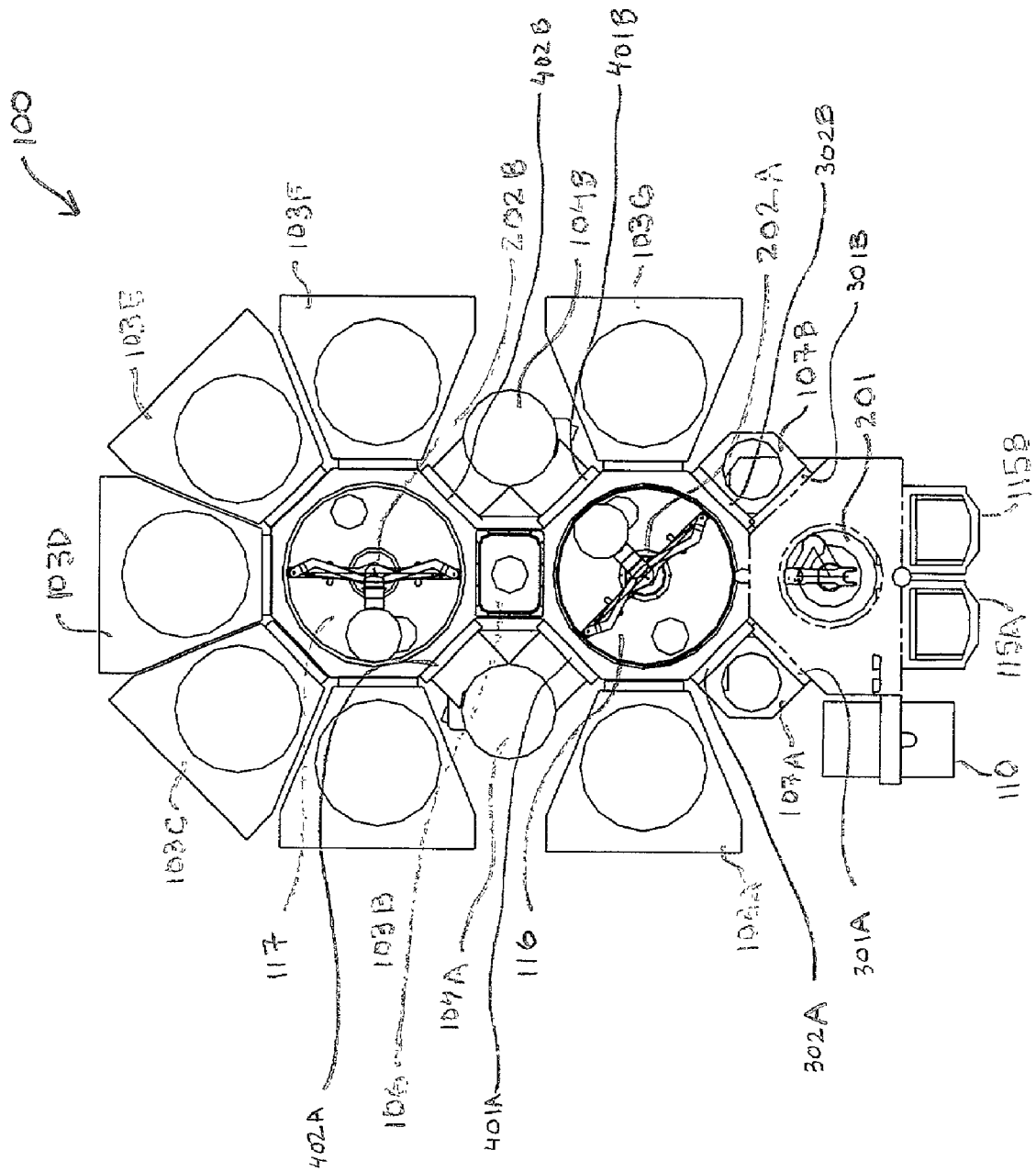
FIG. 2 shows a plan view of a semiconductor wafer processing system 100 in accordance with an embodiment of the present invention.

Still referring to FIG. 1A, front-end module 101 includes a user interface 110, loaders 115 (i.e. 115A, 115B), and an atmospheric robot 201 shown in the plan view of FIG. 2.

Fabrication personnel operate system 100 via user interface 110, which includes a keyboard/track-ball 111 and a flat-panel display 112. System 100 is controlled using a network of computers (not shown) coupled to user interface 110. The use of computers to control a semiconductor wafer processing system, in general, is known in the art and will not be further discussed here. That is, a person of ordinary skill in the art would know how to employ a computer equipped with data acquisition and control cards to control robots, motors, actuators, transducers, gates, mass flow controllers, valves, interlocks, pumps, heaters, gas boxes, sensors, compressors, relays, and other control elements for use in a semiconductor wafer processing system.

Front-end module 101 includes one or more loaders 115 for accepting wafers to be processed. In the present embodiment, loaders 115 are front-opening unified pods (FOUP) from Brooks Automation, Inc. of Chelmsford, Mass. System 100 may also employ any loader of the type generally used in the semiconductor industry including standard mechanical interface (SMIF) pods and cassette modules.

Transport module 102 includes one or more load locks 107 (107A shown in FIG. 1A, 107B shown in FIG. 1B), load chamber 116, transfer chamber 117, and a central pass-through chamber 106. The aforementioned components of transport module 102 are depicted in FIGS. 1A and 1B with their top covers removed for illustration purposes. As can be appreciated, the components of transport module 102 may be manufactured as a single integrated module, or as separate, detachable modules. Each process module 103 is attached to either load chamber 116 or transfer chamber 117 via a wafer transfer port, which may be MESC-compatible per SEMI specifications. Each intermediate process module 104 is also similarly attached to load chamber 116 and transfer chamber 117. In some embodiments, an intermediate process module 104 is attached to load chamber 116, but not to transfer chamber 117.

Load locks 107 buffer the inner modules of system 100 from atmospheric pressure, thereby allowing system 100 to perform what is commonly known as "continuous processing." That is, the inner modules of system 100 can process wafers without having to undergo pump down and vent cycles. This capability of system 100 is now discussed with reference to FIG. 2. Each load lock 107 has an opening 301 (i.e., 301A, 301B) facing atmospheric robot 201 and an opening 302 (i.e., 302A, 302B) facing vacuum robot 202A. To receive a wafer from atmospheric robot 201, opening 301 is opened while opening 302 remains closed. Atmospheric robot 201 then places a wafer in the load lock 107. Thereafter, opening 301 is closed and the load lock 107 is pumped down using a vacuum pump. When the pressure in the load lock 107 is equalized to the pressure in load chamber 116 (which in normal operation is under vacuum), opening 302 is opened to allow vacuum robot 202A to remove the wafer and replace it with another wafer. Opening 302 is then closed, and the load lock 107 is vented to atmospheric pressure. A vent gas such as helium may be introduced into the load lock 107 to facilitate venting. As will be further discussed below, a wafer can also be cooled in the load lock 107 during the vent cycle. Once the load lock 107 is vented, opening 301 is opened to allow atmospheric robot 201 to pick up the wafer from the load lock 107. As is evident from the foregoing, the modules of system 100 forward of opening 302 are not exposed to atmospheric pressure during normal operation, and can thus continually accept wafers from the load locks 107 without having to be vented and pumped down.

Figure 3:
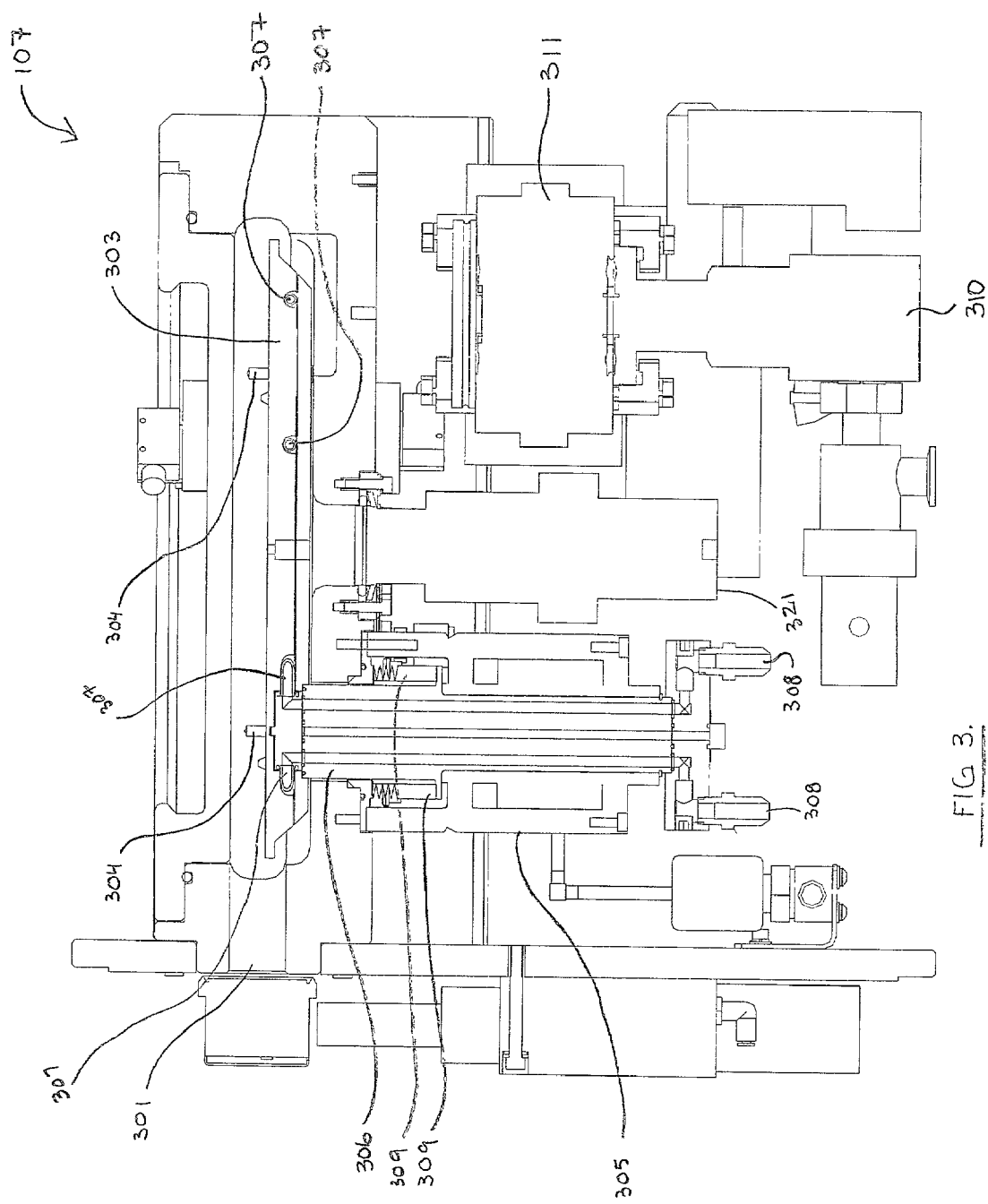
FIG. 3 shows a side cross-sectional view of a load lock in accordance with an embodiment of the present invention.

FIG. 3 shows a side cross-sectional view of a load lock 107. Because load locks 107A and 107B are mirror images of one another, the following discussion equally applies to both load locks. As shown in FIG. 3, a load lock 107 includes a wafer support in the form of a pedestal 303. In this embodiment, the load lock 107 is a single-wafer load lock, and thus has a single pedestal 303 for supporting only one wafer at a time. Because the load lock 107 only needs to accommodate a single wafer, the load lock 107 has a correspondingly small volume, which improves the throughput of system 100 by allowing for fast pump down and vent cycles.

A wafer entering the load lock 107 from either of its openings is first placed on top of pins 304, which protrude through holes (not shown) in pedestal 303. An air cylinder 305 is coupled to a pedestal lift 306, which in turn is fixedly attached to pedestal 303. Actuating air cylinder 305 moves pedestal lift 306 and pedestal 303 in the vertical direction. Bellows assembly 309 maintains a vacuum seal around pedestal lift 306. To support the wafer on pedestal 303 during a pump down or vent cycle, pedestal 303 is transitioned to the up position, thereby lifting the wafer from pins 304. At the end of the pump down or vent cycle, pedestal 303 is transitioned to the down position to lower the wafer back on pins 304. From pins 304, the wafer is picked up by a robot.

While on pedestal 303, the wafer can be cooled by flowing a coolant in an embedded channel 307. In this embodiment, water at a temperature of 20° C. is flown in channel 307 via port 308 to cool a newly processed wafer during a vent cycle. This improves the throughput of system 100 by eliminating the need to move the wafer to a separate cooling station prior to moving the wafer back to its cassette on a loader 115.

A wafer may also be heated while on pedestal 303 by flowing heated liquid in embedded channel 307 or, alternatively, by activating heating elements such as resistors embedded in pedestal 303. The wafer may also be heated inside the load lock 107 using other techniques including by radiation (e.g., using a lamp array). For fabrication processes requiring the wafer to be pre-heated to a certain temperature prior to processing, heating the wafer in the load lock 107 during pump down further improves throughput by eliminating the need to pre-heat the wafer in a separate heating station or in a process module.

Still referring to FIG. 3, a pump 310 (e.g., a turbo pump) is used to pump down the load lock 107 to vacuum after the load lock is roughed through a foreline coupled to foreline valve 321. A gate valve 311 isolates load lock 107 from pump 310 during a vent cycle. In accordance with conventional nomenclature, the term "vacuum" is used in the present disclosure to refer to some low pressure suitable for semiconductor processing, and does not necessarily mean zero pressure. Of course, the specific operating pressures of a load lock 107 and other modules of system 100 depend on specific process requirements.

Besides those disclosed herein, other suitable pedestals, load locks, and techniques for cooling and heating a wafer inside a load lock that may also be employed in the present invention are disclosed in the following commonly-assigned disclosures, which are incorporated herein by reference in their entirety: U.S. patent application Ser. No. 09/346,258, entitled "Wafer Processing Architecture For Maximum Throughput", filed on Jun. 30, 1999; U.S. patent application Ser. No. 09/409,841, entitled "Wafer Processing Architecture Including Load Locks", filed on Sep. 30, 1999; and U.S. patent application Ser. No. 09/635,998, entitled "Apparatus and Method For Semiconductor Wafer Cooling, Heating, And Backside Particle Control", filed on Aug. 9, 2000.

As shown in FIG. 2, system 100, in one embodiment, includes intermediate process modules 104 (i.e. 104A, 104B) that are accessible from load chamber 116 and transfer chamber 117. Each intermediate process module 104 has an opening 401 (i.e., 401A, 401B) facing load chamber 116 and an opening 402 (i.e., 402A, 402B) facing transfer chamber 117. Openings 401 and 402 have isolation valves, such as slit valves or gate valves, that can be closed to isolate the intermediate process module 104 from the rest of system 100 during wafer processing. In some embodiments, an intermediate process module 104 has an opening 401, but no opening 402.

Figure 4:
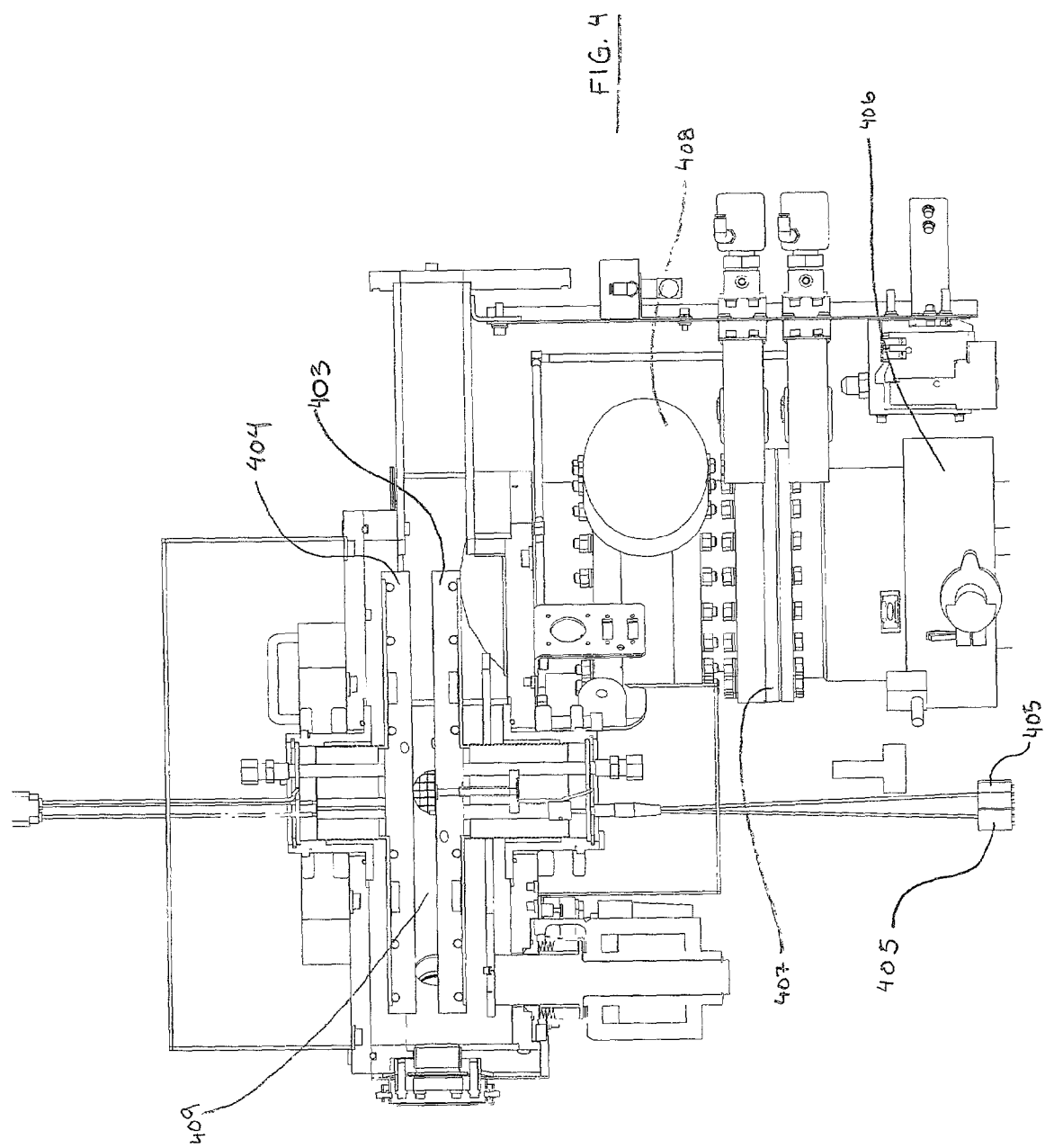
FIG. 4 shows a cross-sectional view of a degas module in accordance with an embodiment of the present invention.

An intermediate process module 104 is used for performing pre-processing, post-processing, or processing steps on a wafer. In one embodiment, an intermediate process module 104 is configured as a degas module, which removes adsorbed water from a wafer by heating. Referring to FIG. 4, there is shown a cross-sectional view of an exemplary intermediate process module 104 configured as a degas module. The degas module of FIG. 4 includes an opening 401 (not shown) and, optionally, an opening 402 (not shown) for allowing a wafer to be placed in and removed from the degas module. A hot pedestal 403 supports and heats the backside of the wafer, while a top heater 404 heats the top or active side of the wafer. The wafer may be heated using a variety of heating techniques including by activating heating elements embedded in hot pedestal 403 and top heater 404. Thermocouple assemblies 405 are coupled to hot pedestal 403 and top heater 404 to monitor their temperatures. In one embodiment, the outputs of thermocouple assemblies 405 are coupled to a heater control unit (not shown) which regulates the temperatures of hot pedestal 403 and top heater 404. To facilitate wafer heating, helium is introduced into the chamber of the degas module at a pressure of approximately 10 Torr; after the wafer is heated, the degas chamber is pumped back down to a pressure approximately equal to that of load chamber 116 or transfer chamber 117 depending on the wafer transfer path.

A throttle valve 408 between a chamber 409 and a turbo pump 406 regulates the evacuation rate of chamber 409 during pump downs. A gate valve 407 isolates turbo pump 406 from chamber 409 during vent cycles. Besides the degas module of FIG. 4, other modules for heating a wafer may also be used as a degas module. For example, in one embodiment, the degas module is of the same type as that offered by Novellus Systems, Inc. for its INOVA XT 300 mm wafer processing system.

Figure 5:
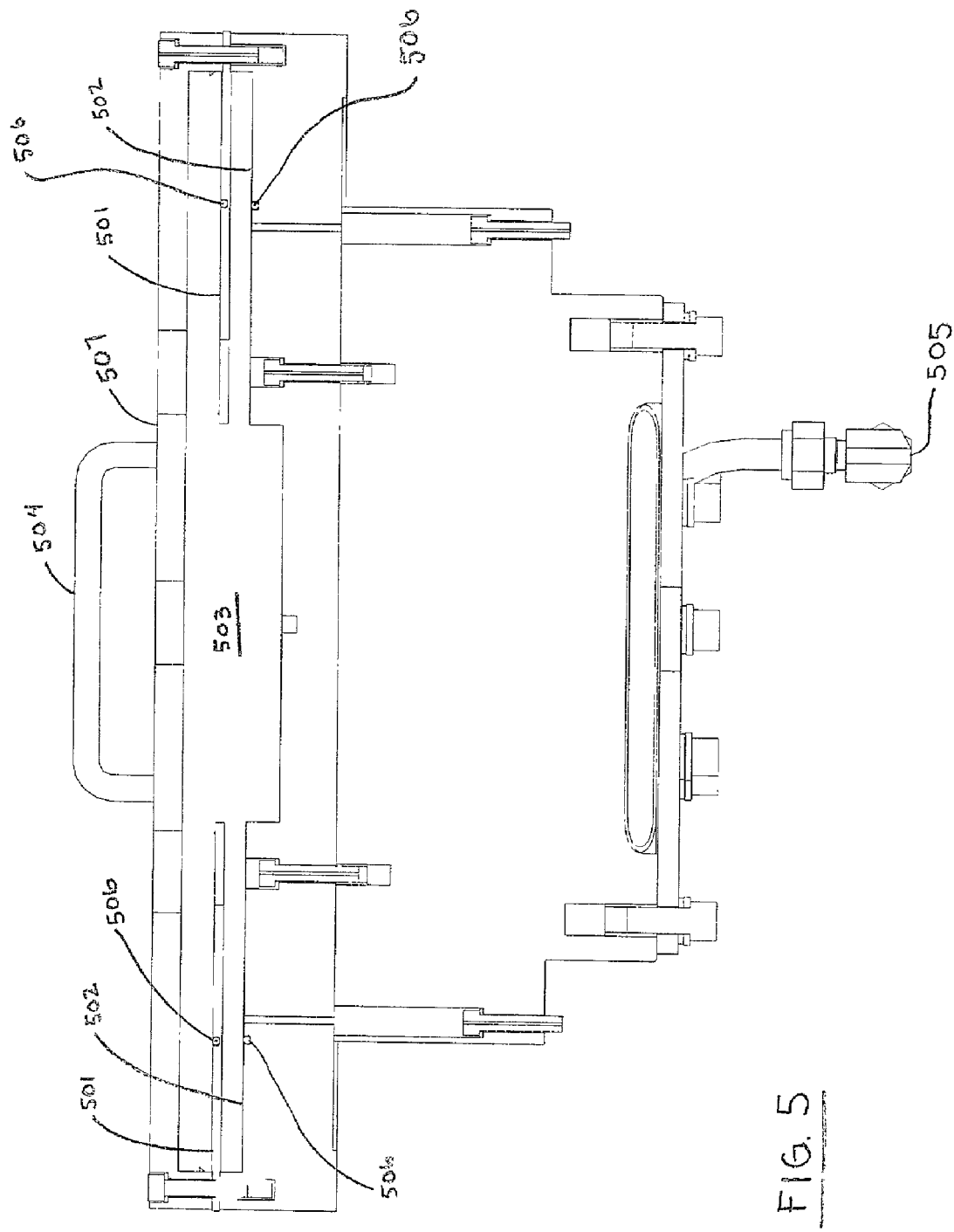
FIG. 5 shows a cross-sectional view of a pass-through chamber configured as a cooling station in accordance with an embodiment of the present invention.

As shown in FIG. 2, central pass-through chamber 106 is located between load chamber 116 and transfer chamber 117. In one embodiment, pass-through chamber 106 is configured as a cooling station for cooling a wafer in-between processing steps. As will be further discussed later on below, this improves the throughput of system 100 by reducing the time spent on cooling the wafer in a process module 103. FIG. 5 shows a cross-sectional view of an exemplary pass-through chamber 106 configured as a cooling station. The cooling station of FIG. 5 has shelves 501 for cooling a wafer, and shelves 502 for cooling another wafer. Of course, the number of shelves incorporated in the cooling station depends on specific requirements. The middle section of the cooling station, labeled as area 503, has enough space to allow a robot arm to be positioned underneath a wafer to pick it up. Similarly, there is enough space for the robot arm to lower a wafer on shelves 501 or 502, and then retract. A handle 504 is provided for conveniently lifting off top cover 507 during maintenance, for example. In this embodiment, wafers are cooled by circulating a coolant such as water in embedded cooling channel 506 via coolant inlet 505 (a corresponding coolant outlet is not shown). In lieu of the cooling station of FIG. 5, other types of wafer cooling stations may also be used as a pass-through chamber 106.

In some embodiments, an isolation valve (e.g., see isolation valve 901 of FIGS. 9B, 9C, 9D, 10A, and 10B) is placed between load chamber 116 and transfer chamber 117. This allows the modules attached to transfer chamber 117 (the "back-end" of system 100) to be isolated from the modules attached to load chamber 116 (the "front-end" of system 100). Isolating load chamber 116 from transfer chamber 117 allows process modules running incompatible or contamination-sensitive processes to be 15, separated. In systems 100 with an isolation valve between the load and transfer chambers (e.g., the systems 100 of FIGS. 9B, 9C, 9D, 10A, and 10B), the intermediate process modules 104 are not equipped with openings 402 facing transfer chamber 117.

In some embodiments, transfer chamber 117 is equipped with a vacuum unit capable of pumping down transfer chamber 117 to either high pressure or low pressure.

This capability is commonly referred to as "Hi-Lo," and is employed when the mix of modules attached to transfer chamber 117 includes high pressure and low pressure modules. For example, chemical vapor deposition (CVD) modules typically operate at high pressures (e.g., 0.5–200 Torr), whereas physical vapor deposition (PVD) modules operate at lower pressures (e.g., $\sim10^{-7}$ Torr transfer pressure; $0.5-20\times10^{-3}$ Torr process pressure). In that case, the CVD and PVD modules are attached to transfer chamber 117, and an isolation valve is installed between transfer chamber 117 and load chamber 116. Pumping down (or venting) transfer chamber 117 to a relatively high pressure with the isolation valve closed allows the chamber of a CVD module to be exposed to transfer chamber 117. Similarly, transfer chamber 117 is pumped down to a relatively low pressure to allow the chamber of a PVD module to be exposed to transfer chamber 117.

Figure 6:
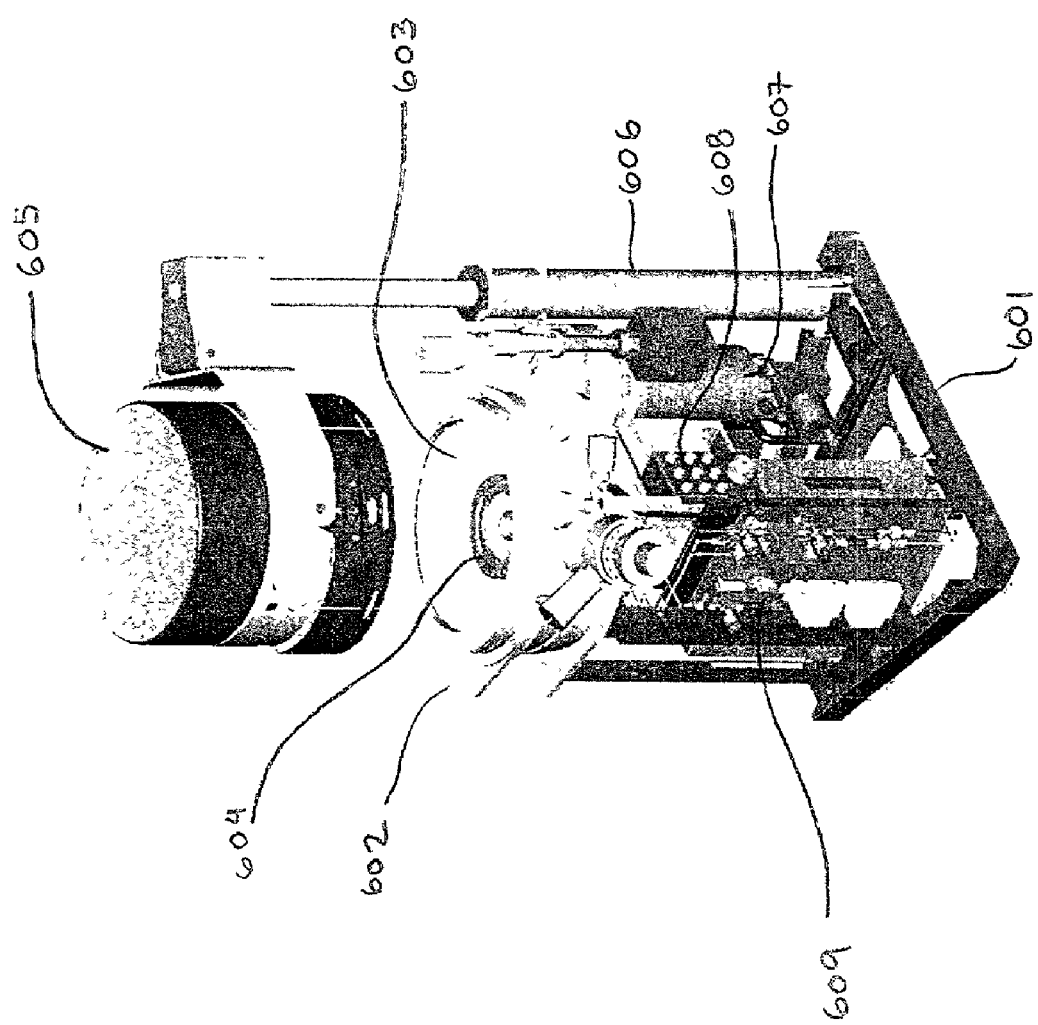
FIG. 6 shows a perspective view of a process module in accordance with an embodiment of the present invention.

As mentioned, system 100 also includes process modules 103 that are attached to either load chamber 116 or transfer chamber 117. A process module 103 includes a chamber for performing pre-processing, post-processing, or processing steps on a wafer. The general mechanical configuration of an exemplary process module 103 is now described with reference to the perspective view of FIG. 6. As shown in FIG. 6, the components of the process module 103 are supported by a frame 601. The process module 103 is attached to either load chamber 116 or transfer chamber 117 via a wafer transfer port 602, which is MESC-compatible in this embodiment. Typically, a robot arm enters a chamber 603 via the wafer transfer port 602, and places the wafer on an electrostatic chuck 604. Other types of wafer supports may also be used in lieu of an electrostatic chuck.

As depicted in FIG. 6, a source 605 is lifted over chamber 603 using a hoist assembly 606. Hoist assembly 606 conventionally lowers and lifts source 605 for maintenance purposes, for example. In normal operation, source 605 covers chamber 603 and forms a vacuum seal therewith. A pump 607 pumps down chamber 603 to a pressure suitable for wafer processing. Also shown in FIG. 6 is an operator's panel 608 for manually actuating the components (e.g., hoist assembly, emergency stop circuit) of the process module 103, and a control electronics assembly 609 coupled to the computer network (not shown) of system 100. Electronics assembly 609 includes circuitry for data acquisition and control, interlock monitoring, and computer interfacing.

Source 605 can be any type of source used in the semiconductor industry including those used for physical vapor deposition (PVD) or chemical vapor deposition (CVD).

Figure 7:
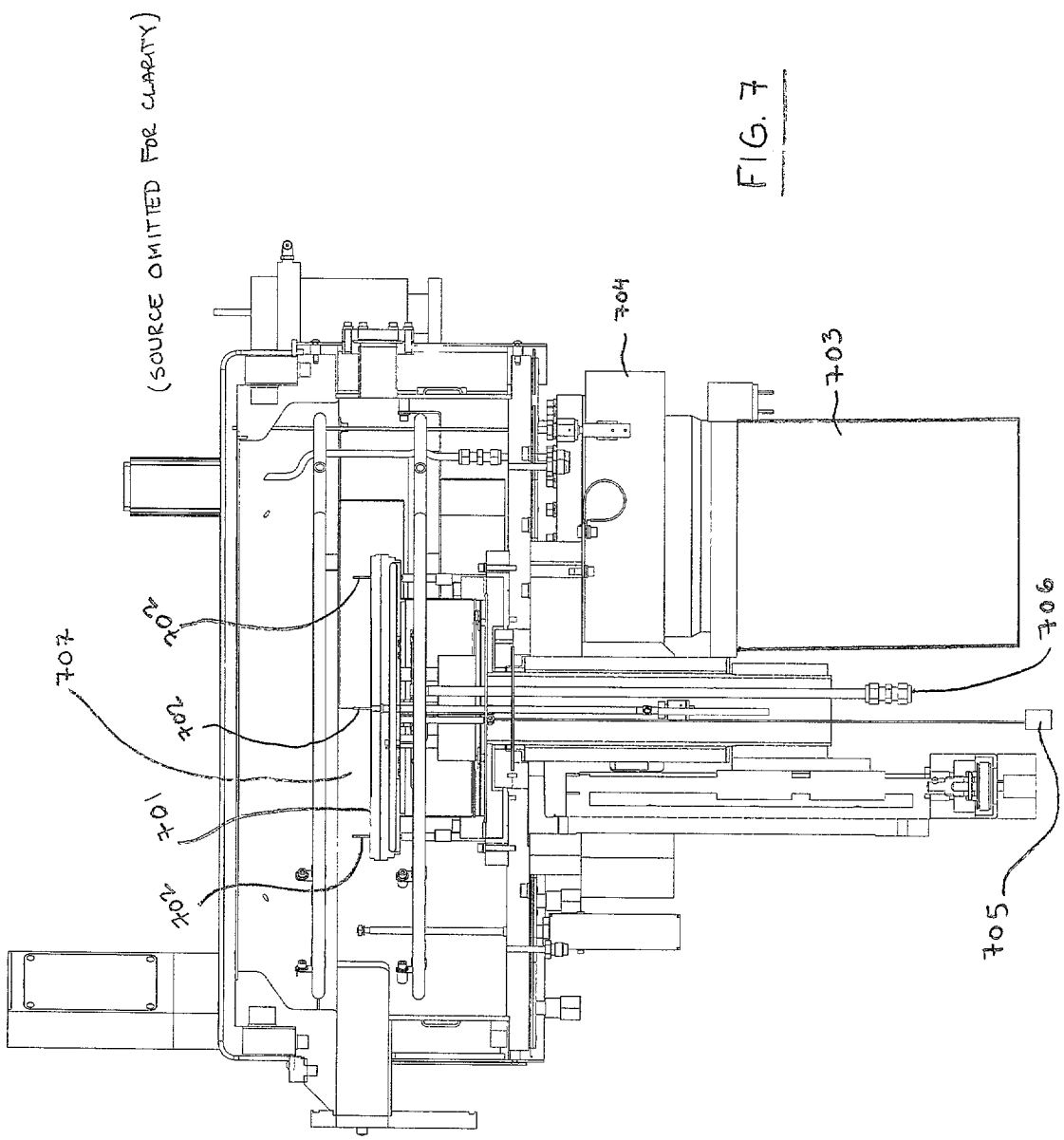
FIG. 7 shows a cross-sectional view of a process module configured for physical vapor deposition in accordance with an embodiment of the present invention.

FIG. 7 shows a cross-sectional view of an exemplary process module 103 configured for PVD. Shown in FIG. 7 is a PVD module without its source. In one 1 embodiment, the source of the PVD module is a hollow cathode magnetron source of the same type as that disclosed in U.S. Pat. No. 6,179,973, entitled "Apparatus And Method For Controlling Plasma Uniformity Across A Substrate," incorporated herein by reference in its entirety. The just-mentioned patent is assigned to Novellus Systems, Inc., which is also the assignee of the present disclosure. The source for the PVD module of FIG. 7 may also be a planar magnetron source. Referring to FIG. 7, the PVD module includes pins 702 for supporting a wafer being transferred. Pins 702 protrude through an electrostatic chuck 701 that is movable in the vertical direction (using a lifting mechanism similar to that of pedestal 303 of a load lock 107, for example). To place a wafer in the PVD module for processing, a robot arm enters chamber 707 and places the wafer on pins 702. Thereafter, electrostatic chuck 701 is transitioned to the up position, thereby lifting the wafer from pins 702. After processing, electrostatic chuck 701 is transitioned to the down position to lower the wafer back on pins 702, where the robot arm can pick-up and remove the newly processed wafer from the PVD module.

Electrostatic chuck 701 supports the wafer during processing, and prevents the wafer from moving by clamping it with electrostatic force. The temperature of electrostatic chuck 701 (and thus the approximate temperature of the wafer resting on it) is monitored using a thermocouple assembly 705. To regulate the temperature of electrostatic chuck 701, a coolant such as water is circulated in embedded cooling channels (not shown) coupled to coolant inlet 706 (a corresponding coolant outlet is not shown). Other mechanisms for supporting and holding a wafer may also be used in lieu of the electrostatic chuck. Still referring to FIG. 7, a cryo pump 703 pumps down chamber 707 to a pressure suitable for sputtering. A gate valve 704 allows chamber 707 to be isolated from cryo pump 703.

In one embodiment, PVD and CVD modules of the same type as that offered by Novellus Systems, Inc. for its INOVA XT 300 mm wafer processing system are used as process modules 103. For example, modules available from Novellus Systems, Inc. for depositing tantalum (Ta), copper (Cu), titanium (Ti), titanium nitride (TiN), aluminum, and various dielectric, metal, adhesion, and barrier materials on a wafer are suitable for use in the present invention.

FIG. 8 shows a cross-sectional view of an exemplary process module 103 configured for running a "pre-clean" process. Generally speaking, a pre-clean process prepares a wafer for sputtering or chemical vapor deposition by removing a thin layer (e.g., ~200 Angstroms) from the top surface of the wafer. The removed layer may be a contact surface, a via bottom surface, or film deposited on the wafer, for example. Shown in FIG. 8 is a pre-clean module without its source. Similar to the PVD module of FIG. 7, the pre-clean module has pins 801 for supporting a wafer being transferred. Pins 801 protrude through an electrostatic chuck 802, which supports and holds the wafer during processing. Electrostatic chuck 802 is movable in the vertical direction using a lifting mechanism similar to that of pedestal 303 of a load lock 107. The temperature of electrostatic chuck 802 is regulated by circulating coolant in embedded cooling channels (not shown) coupled to coolant inlet 803 and coolant outlet 804. An optical probe assembly 805 monitors the temperature of the wafer being processed by pyrometry. In one embodiment, optical probe assembly 805 is an in-situ wafer temperature monitor from Cl Systems of Israel.

Still referring to FIG. 8, a turbo pump 806, which is coupled to chamber 810 through a gate valve 807, pumps down chamber 810 to a pressure suitable for wafer processing. A radio frequency (RF) matching unit 808 matches the characteristic impedance of the pedestal and low frequency plasma in chamber 810 to the output impedance of an RF generator supplying RF power to the pre-clean module via connector 809.

In one embodiment, the pre-clean module is of the same type as that offered by Novellus Systems, Inc. for its INOVA XT 300 mm wafer processing system.

It is to be noted that a process module 103 may be configured to be other than a PVD module or pre-clean module discussed above. For example, a process module 103 may also be configured as a chemical vapor deposition module, a degas module, or a cooling station.

The general operation of a system 100 is now described with reference to FIG. 2. A cassette containing wafers to be processed is manually loaded by fabrication personnel on a loader 115 (115A or 115B). Of course, with the appropriate loader, system 100 may also accept wafers from an automated guided vehicle (AGV) or other factory automation system, for example. Atmospheric robot 201, which may be an atmospheric robot from Brooks Automation, Inc., picks up a wafer from the cassette and moves the wafer to a load lock 107 (107A or load lock 107B, whichever is available). A vacuum robot 202A in load chamber 116 picks up the wafer from the load lock 107 and, depending on the fabrication process to be performed, moves the wafer to process module 103A, process module 103G, intermediate process module 104A, intermediate process module 104B, or pass-through chamber 106. Depending on the fabrication process, the wafer reaches transfer chamber 117 through intermediate process module 104A, intermediate process module 104B, or pass-through chamber 106. A vacuum robot 202B then picks up and moves the wafer to a process module attached to transfer chamber 117. Vacuum robots 202A and 202B are vacuum robots of the type generally used in the semiconductor industry such as those available from Brooks Automation, Inc. Depending on the fabrication process, the wafer may go through any module attached to load chamber 116 and/or transfer chamber 117 on its way back to its cassette on the loader 115 via a load lock 107 (107A or 107B, whichever is available). To improve throughput, the wafer is cooled in the load lock 107 while the load lock 107 is vented to atmosphere.

In another aspect of the present invention, the arrangement of modules of a system 100 is optimized to minimize the number of wafer transfers, and thereby improve throughput. Specifically, in the following module arrangements and wafer transfer paths, the modules are strategically located to balance the processing load of a system 100 for a given type of process. Of course, the present invention is not limited to the aforementioned module arrangements; a person of ordinary skill having the benefit of this disclosure will be able to come up with alternative, equivalent arrangements. Further, while the following wafer transfer paths are described using a single wafer as an example, the present invention is not so limited and may be used to process multiple wafers at the same time.

FIGS. 9A, 9B, 9C, and 9D show plan views of systems 100 optimized for depositing copper barrier and seed layers on a wafer for copper metallization. Table 1 summarizes the wafer transfer path for the system 100 of FIG. 9A.

TABLE 1

Figure 9A:
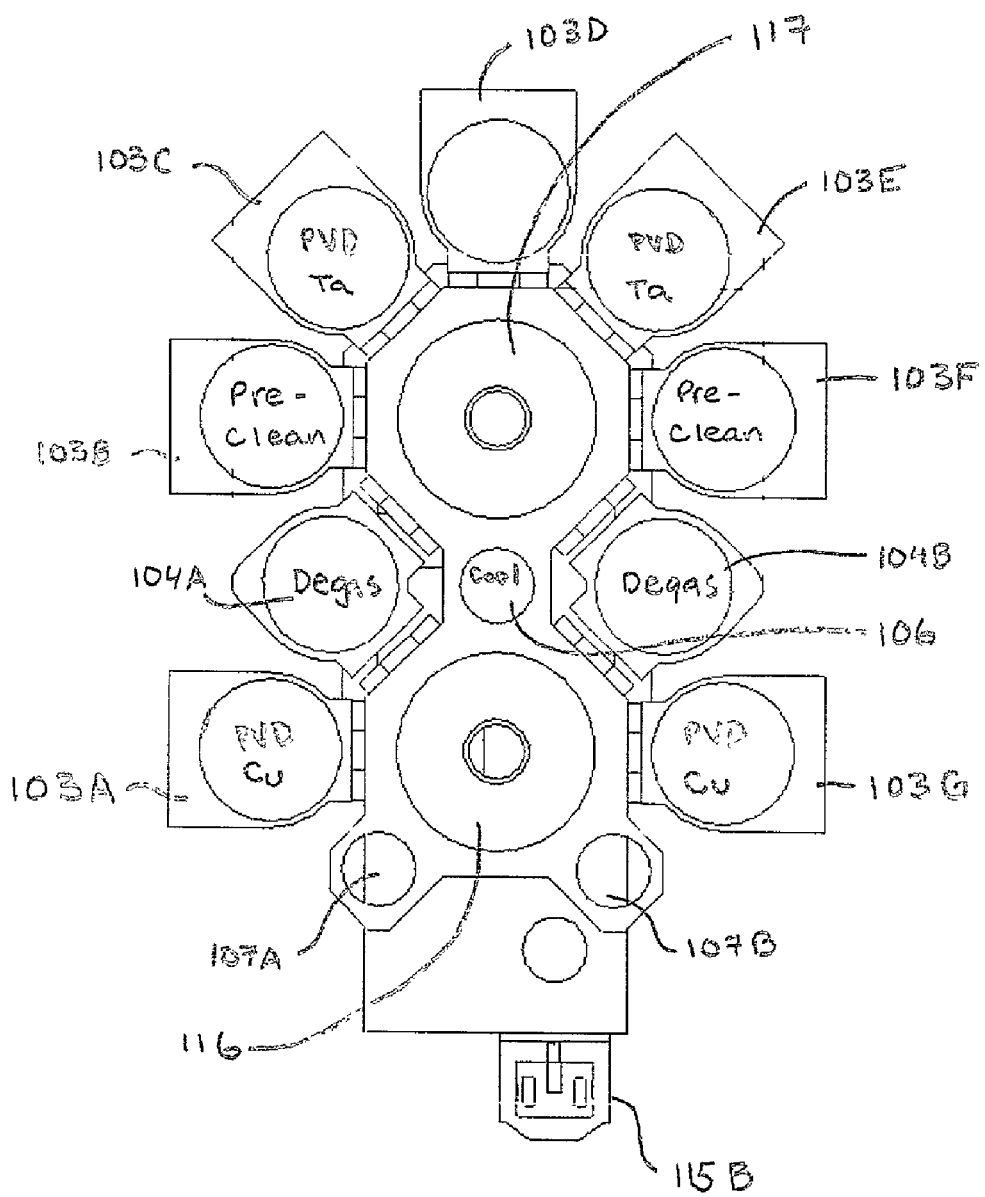
FIGS. 9A, 9B, 9C, and 9D show plan views of wafer processing systems optimized for running barrier/seed processes in accordance with an embodiment of the present invention.

WAFER TRANSFER PATH FOR THE SYSTEM OF FIG. 9A (1) Loading Station 115A or 115B
(2) Load Lock 107A or 107B
(3) Degas Module (Intermediate Process Module 104A or 104B)
(4) Pre-Clean (Process Module 103B or 103F)
(5) PVD Tantalum (Process Module 103C or 103E)
(6) Cooling in Pass-Through Chamber (Central Pass-Through Chamber 106)
(7) PVD Copper (Process Module 103A or 103G)
(8) Load Lock 107A or 107B
(9) Loading Station 115A or 115B (wherever the wafer's cassette is)

Referring to FIG. 9A and Table 1, a wafer is transferred from its cassette on a loading station 115 to a load lock 107 (either 107A or 107B, whichever is available). Once the wafer is in the load lock 107, the load lock 107 is sealed and pumped down to approximately the same pressure as that of load chamber 116. Thereafter, the wafer is transferred from the load lock 107 to an intermediate process module 104 (either 104A or 104B, whichever is available), which is configured as a degas module for removing adsorbed water from the wafer. In one embodiment, the wafer is heated in the degas module to a temperature greater than 300° C. Thereafter, the wafer is transferred to process module 103B or 103F, each of which is configured as a pre-clean module for preparing the surface of the wafer prior to depositing a layer of copper barrier material, such as tantalum, thereon. In the example of FIG. 9A, each intermediate process module 104 configured as a degas module has an opening facing load chamber 116 and another opening facing transfer chamber 117. This allows the wafer to be loaded into the intermediate process module 104 using the vacuum robot in load chamber 116, and be picked up from the intermediate process module 104 by the vacuum robot in transfer chamber 117. As can be appreciated, throughput is thereby improved because the wafer is transferred from the front-end, to a degas module, and then directly to a pre-clean module in the back-end without having to stop at a separately located wafer hand-off location.

Still referring to FIG. 9A and Table 1, the wafer is transferred from the pre-clean module to process module 103C or 103E, each of which is configured as a PVD module for depositing tantalum or tantalum nitride on the wafer. The tantalum acts as a barrier layer to prevent a subsequently deposited copper layer from migrating into the dielectric layer. From the PVD tantalum module, the wafer is then transferred to the pass-through chamber 106 configured as a cooling station. There, the wafer is cooled prior to being transferred to process module 103A or 103G, each of which is configured as a PVD module for depositing a copper seed layer on the wafer. The use of pass-through chamber 106 as a cooling station allows the wafer to be cooled on its way from the PVD tantalum module in the back-end to the PVD copper module in the front-end, thereby improving throughput by reducing the time spent cooling the wafer in the aforementioned PVD modules. Cooling the wafer to a temperature less than 100° C. after the tantalum deposition and prior to copper deposition has been found to minimize grain size (for lower resistivity) and to decrease agglomeration. An alternative technique for achieving the just mentioned advantages would be to cool the wafer for 35 seconds in the PVD tantalum module after tantalum deposition and then to cool the wafer for 15 seconds in the PVD copper module prior to copper deposition. Using the pass-through chamber 106 to cool the wafer on its way from the back-end to the front-end of system 100 reduces the total cooling time in the PVD modules by approximately 10 seconds in some instances. This allows the PVD modules to spend most of their time depositing materials on the wafers, rather than cooling them.

As shown in Table 1, the wafer is transferred from the PVD copper module to a load lock 107 (107A or 107B, whichever is available). The wafer is cooled in the load lock 107 while the load lock is being vented to atmosphere. This further improves throughput by eliminating the need to cool the wafer in a separate cooling station prior to returning the wafer to its cassette. After the load lock 107 is vented to atmosphere, the opening of the load lock 107 facing the loading station 115 is opened to allow an atmospheric robot to pick-up the wafer and return it to its cassette on the loading station 115.

In one embodiment, the process disclosed in commonly-assigned U.S. application Ser. No. 09/491,853, filed on Jan. 26, 2000, by Erich Klawuhn, Kwok Fai Lai, Patrick Rymer, Maximillian, Biberger, Karl Levy, and Kaihan Ashtiani is used in conjunction with the wafer transfer path of Table 1. Of course, the wafer transfer path of Table 1, and all other wafer transfer paths in the present disclosure, is not limited to any specific set of process parameters. For example, other processes for degassing, pre-cleaning, tantalum and tantalum nitride deposition, and copper deposition commonly used in the semiconductor industry may also be employed in the modules specified in Table 1.

Figure 9B:
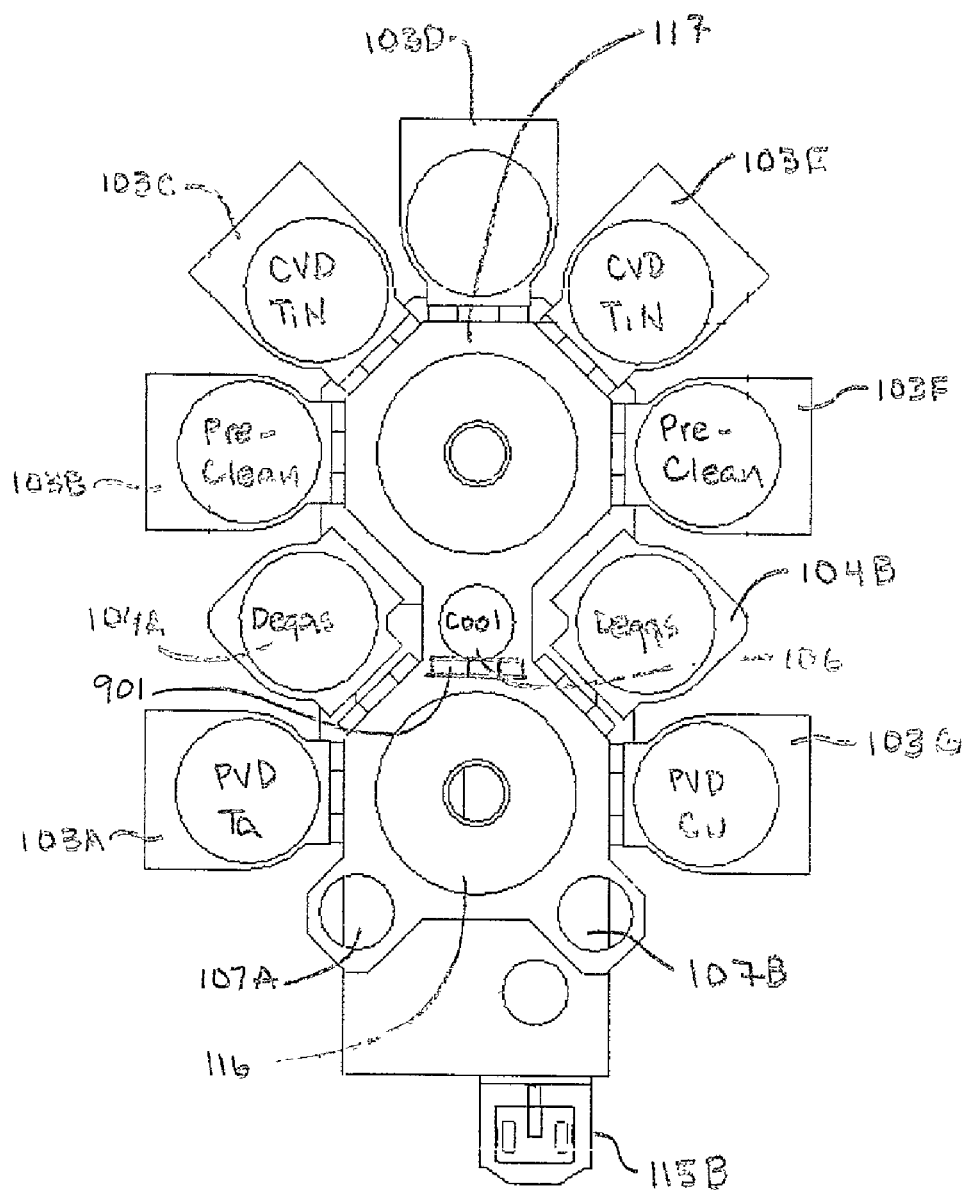

The system 100 of FIG. 9B and wafer transfer path of Table 2 illustrate another way of depositing copper barrier and seed layers on a wafer in accordance with an embodiment of the present invention; in the system 100 of FIG. 9B, a CVD based barrier is used instead of a PVD based barrier. Unlike the system 100 of FIG. 9A, the system 100 of FIG. 9B has an isolation valve 901 for isolating load chamber 116 from transfer chamber 117. As mentioned, isolation valve 901 is employed to separate process modules running incompatible or contamination-sensitive processes. Similarly, the systems 100 of FIGS. 9C, 9D, 10A, and 10B have an isolation valve 901, and intermediate transfer modules 104 that do not open to transfer chamber 117.

TABLE 2

WAFER TRANSFER PATH FOR THE SYSTEM OF FIG. 9B (1) Loading Station 115A or 115B
(2) Load Lock 107A or 107B
(3) Degas Module (Intermediate Process Module 104A or 104B)
(4) Central Pass-Through Chamber 106 (Hand-off only)
(5) Pre-Clean (Process Module 103B or 103F)
(6) CVD Titanium Nitride (Process Module 103C or 103E)
(7) Central Pass-Through Chamber 106 (Cooling)
(8) PVD Tantalum (Process Module 103A)
(9) PVD Copper (Process Module 103G)
(10) Load Lock 107A or 107B
(11) Loading Station 115A or 115B (wherever the wafer's cassette is)

Referring to FIG. 9B and Table 2, a wafer is transferred from a loading station 115, to a load lock 107, and then to a degas module (intermediate process modules 104A or 104B). From the degas module, the wafer is transferred to the back-end by opening isolation valve 901 and placing the wafer in pass-through chamber 106. Isolation valve 901 is then closed. (Note that isolation valve 901 is opened and closed to allow a wafer to be transferred from the front-end to the back-end, and vice versa.) In transferring the wafer from the front-end to the back-end, pass-through chamber 106 is used only as a hand-off location. Accordingly, the wafer is immediately transferred from pass-through chamber 106 to a pre-clean module (process module 103B or 103F) in the back-end.

In the system 100 of FIG. 9B, transfer chamber 117 is capable of Hi-Lo operation for operating transfer chamber 117 at high pressure when isolation valve 901 is closed and the chamber of a CVD titanium nitride module is open, and at low pressure when isolation valve 901 is open and transfer chamber 117 is exposed to load chamber 116 (which has PVD copper and tantalum modules attached thereto). After preparing the surface of the wafer at the pre-clean module, the wafer is transferred to a CVD titanium nitride module (process module 103C or 103E). There, a layer of titanium nitride, which is a barrier for subsequently deposited copper layer, is deposited on the wafer by CVD. From the CVD titanium nitride module, the wafer is cooled in pass-through chamber 106 and then transferred to a PVD tantalum module (process module 103A) in the front-end to deposit tantalum on the wafer. Thereafter, a copper seed layer is deposited on the wafer in a PVD copper module (process module 103G). In the system 100 of FIG. 9B, the wafer is cooled in the PVD tantalum module after the tantalum deposition, and in the PVD copper module prior to the deposition of the copper seed layer. From the PVD copper module, the wafer is cooled in a load lock 107, and transferred back to its cassette on the loading station 115.

Figure 9C:
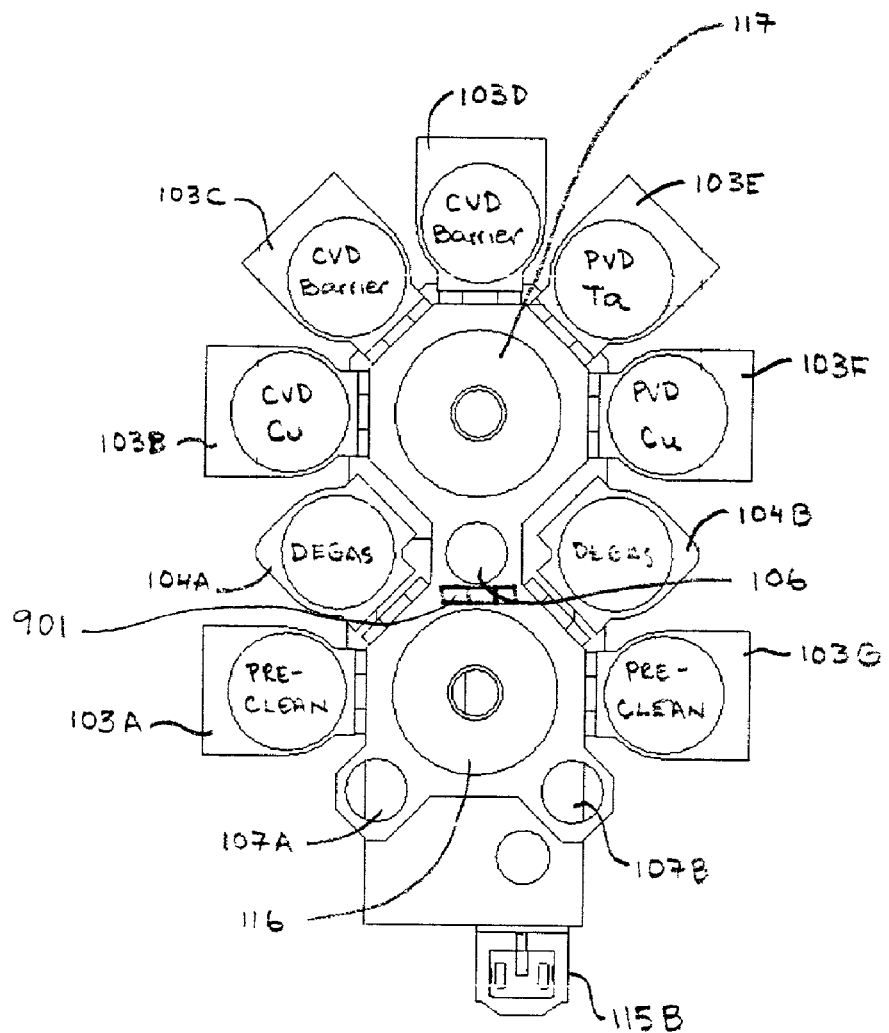

The system 100 of FIG. 9C and wafer transfer path of Table 3 illustrate another way of depositing copper barrier and seed layers on a wafer in accordance with an embodiment of the present invention. As shown in FIG. 9C and Table 3, a wafer is transferred from a loading station 115, to a load lock 107, and then to a degas module (intermediate process module 104A or 104B). From the degas module, the surface of the wafer is prepared in a pre-clean module (process module 103A or 103G). Thereafter, the wafer is transferred to the back-end by placing the wafer in pass-through chamber 106. In the system 100 of FIG. 9C, pass-through chamber 106 is only used as a hand-off location for transferring the wafer between load chamber 116 and transfer chamber 117. Further, transfer chamber 117 in this embodiment is capable of Hi-Lo operation. From pass-through chamber 106, the wafer is transferred to a CVD barrier module (process module 103C or 103D) in the back-end for deposition of a titanium nitride layer. From the CVD barrier module, the wafer is optionally transferred to a PVD tantalum module (process module 103E) where a barrier layer of tantalum is deposited on the wafer using a PVD process. After the PVD of tantalum, the wafer is transferred to a PVD copper module (process module 103F) for deposition of a copper seed layer using a PVD process. The wafer is cooled between the PVD of tantalum and the PVD of copper. Thereafter, another copper layer is optionally deposited on the wafer using a CVD process in a CVD copper module to obtain a continuous seed (seed repair) (process module 103B). From the CVD copper module, the wafer is transferred to pass-through chamber 106 for hand-off, and then transferred back to its cassette on the loading station 115 via a load lock 107. The wafer is cooled in the load lock 107 while the load lock is vented to atmosphere.

TABLE 3

WAFER TRANSFER PATH FOR THE SYSTEM OF FIG. 9C

| | |
|---|---|
| (1) | Loading Station 115A or 115B |
| (2) | Load Lock 107A or 107B |
| (3) | Degas Module (Intermediate Process Module 104A or 104B) |
| (4) | Pre-Clean (Process Module 103A or 103G) |
| (5) | Central Pass-Through Chamber 106 (Hand-off only) |
| (6) | CVD Barrier (Process Module 103C or 103D) |
| (7) | PVD Tantalum (Process Module 103E) (Optional) |
| (8) | PVD Copper (Process Module 103F) |
| (9) | CVD Copper (Process Module 103B) (Optional) |
| (10) | Central Pass-Through Chamber 106 (Hand-off only) |
| (11) | Load Lock 107A or 107B |
| (12) | Loading Station 115A or 115B (wherever the wafer's cassette is) |

Figure 9D:
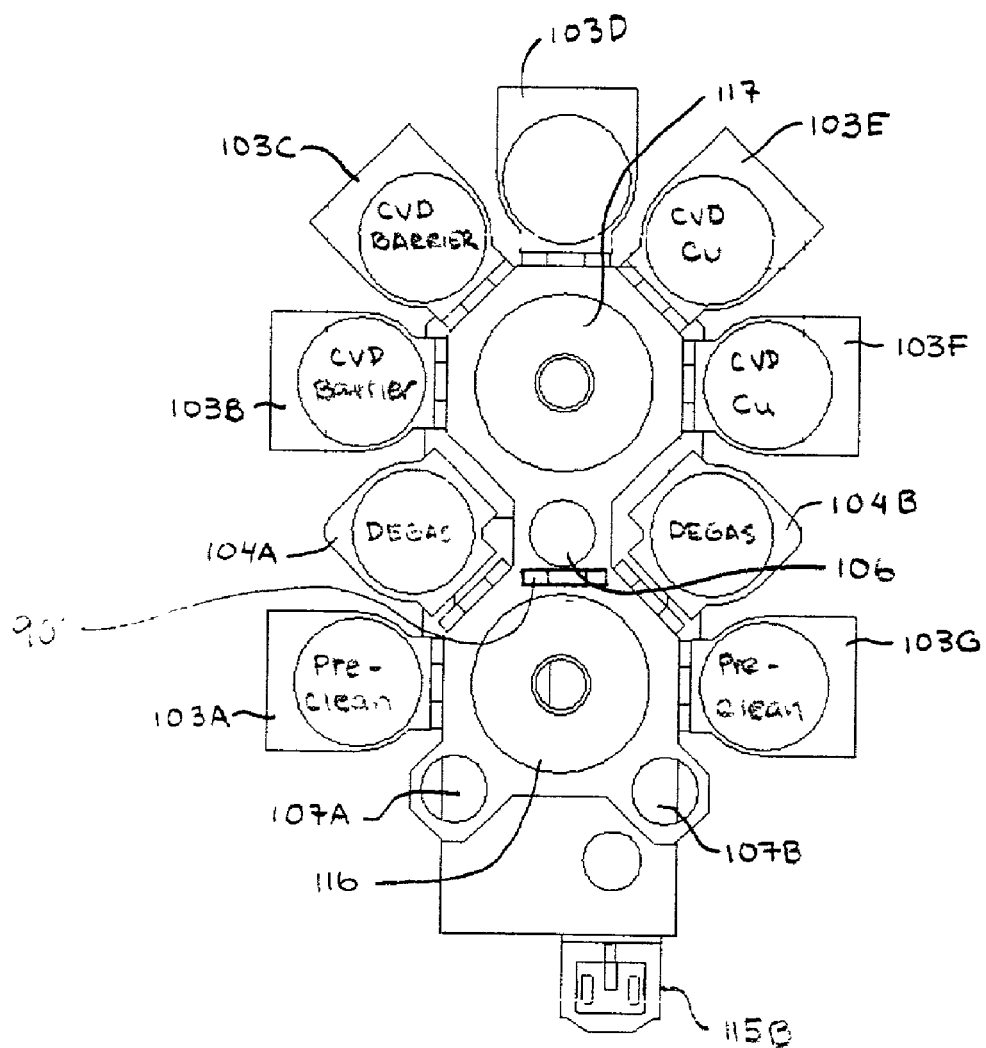

The system 100 of FIG. 9D and wafer transfer path of Table 4 illustrate another way of depositing copper barrier and seed layers on a wafer in accordance with an embodiment of the present invention. Referring to FIG. 9D and Table 4, a wafer is transferred from a loading station 115, to a load lock 107, and then to a degas module (intermediate process module 104A or 104B). From the degas module, the surface of the wafer is prepared in a pre-clean module (process module 103A or 103G). Thereafter, the wafer is transferred to the back-end by placing the wafer in pass-through chamber 106. In the system 100 of FIG. 9D, pass-through chamber 106 is only used as a hand-off location for transferring the wafer between load chamber 116 and transfer chamber 117, and accordingly is not configured as a cooling station. Further, transfer chamber 117 in this embodiment is capable of Hi-Lo operation. From pass-through chamber 106, the wafer is transferred to a CVD barrier module (process module 103B or 103C) in the back-end for deposition of a CVD based barrier. From the CVD barrier module, the wafer is transferred to a CVD copper module for deposition of a copper seed layer (process module 103E or 103F). From the CVD copper module, the wafer is transferred to pass-through chamber 106 for hand-off, and transferred back to its cassette on the loading station 115 via a load lock 107. The wafer is cooled in the load lock 107 while the load lock is vented to atmosphere.

TABLE 4

WAFER TRANSFER PATH FOR THE SYSTEM OF FIG. 9D

| | |
|---|---|
| (1) | Loading Station 115A or 115B |
| (2) | Load Lock 107A or 107B |
| (3) | Degas Module (Intermediate Process Module 104A or 104B) |
| (4) | Pre-Clean (Process Module 103A or 103G) |
| (5) | Central Pass-Through Chamber 106 (Hand-off only) |
| (6) | CVD Barrier (Process Module 103B or 103C) |
| (7) | CVD Copper (Process Module 103E or 103F) |
| (8) | Central Pass-Through Chamber 106 (Hand-off only) |
| (9) | Load Lock 107A or 107B |
| (10) | Loading Station 115A or 115B (wherever the wafer's cassette is) |

Figure 10A:
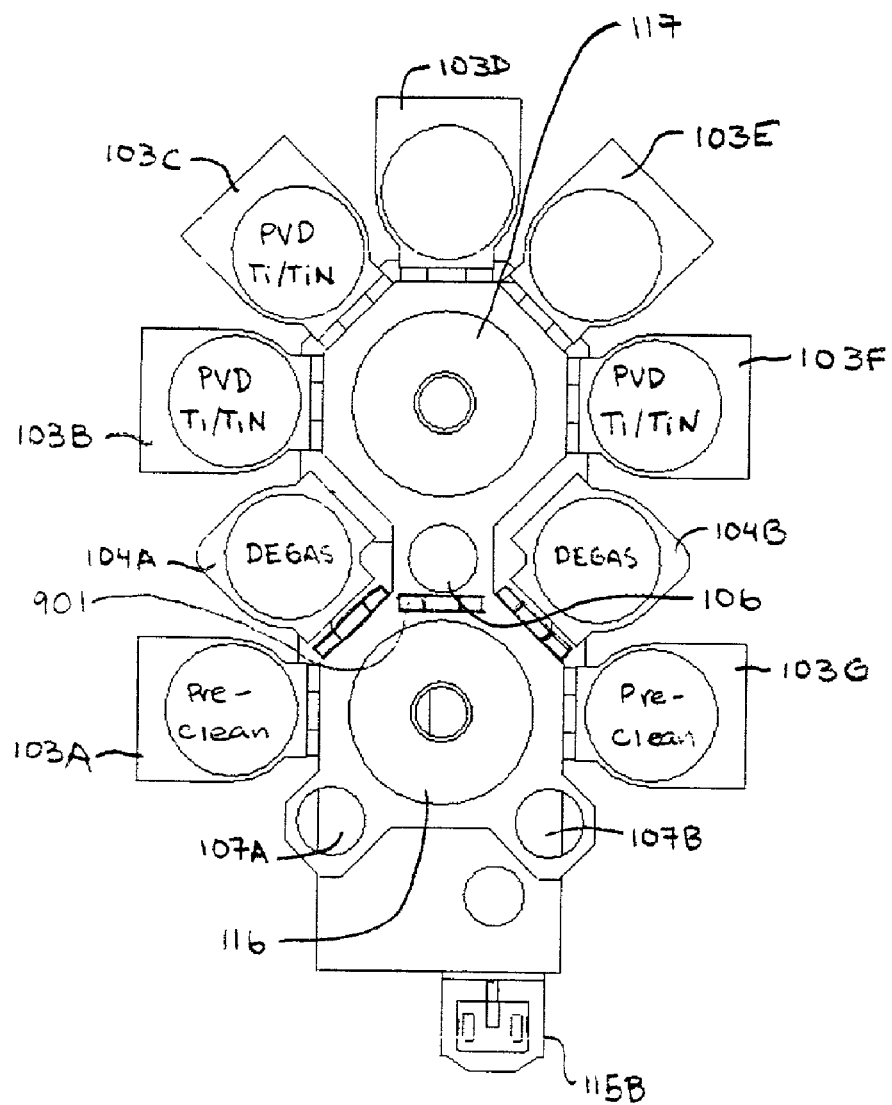
FIGS. 10A and 10B show plan views of wafer processing systems optimized for running liner/barrier processes in accordance with an embodiment of the present invention.
Figure 10B:
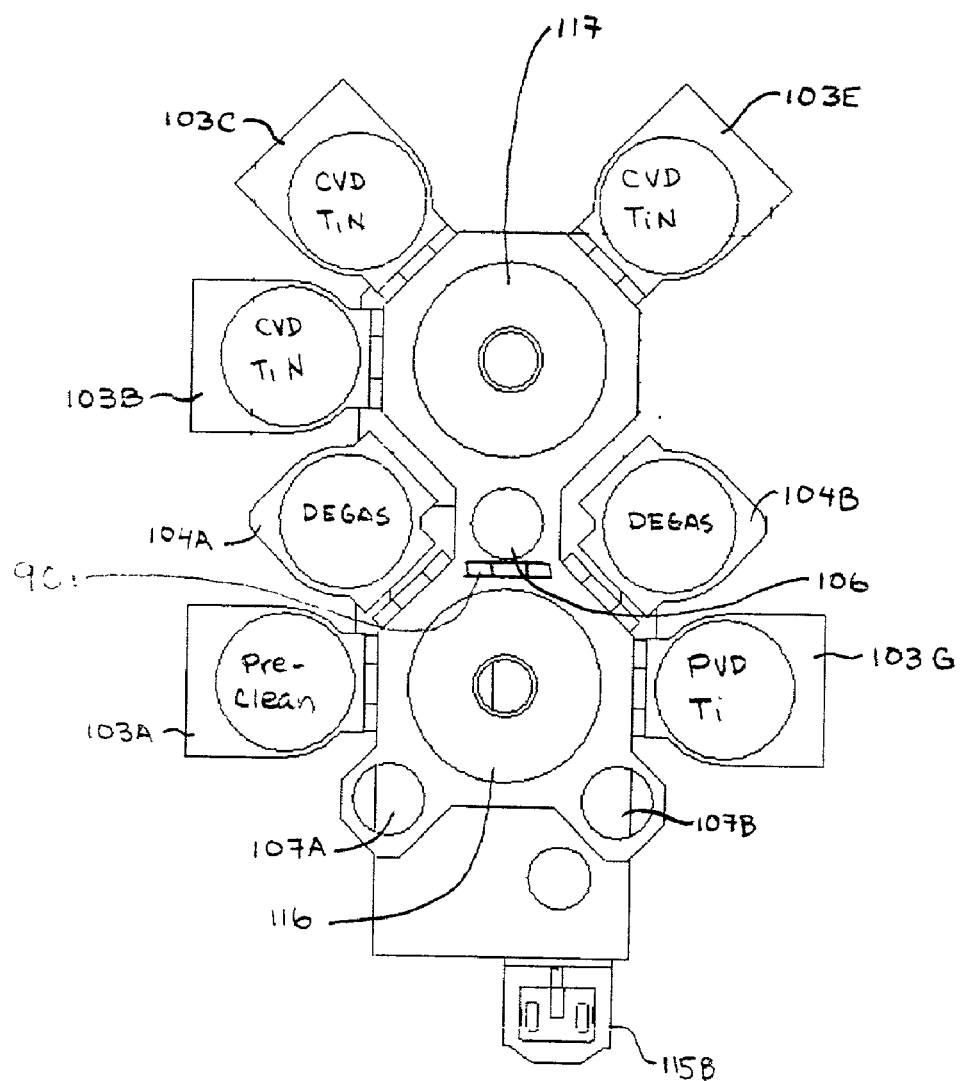

FIGS. 10A and 10B show plan views of systems 100 optimized for deposition of an adhesion layer of titanium and a barrier layer of titanium nitride. Referring to the system 100 of FIG. 10A and the wafer transfer path of Table 5, a wafer is transferred from a loading station 115, to a load lock 107, and then to a degas module (intermediate process module 104A or 104B). From the degas module, the surface of the wafer is prepared in a pre-clean module (process module 103A or 103G). Thereafter, the wafer is transferred to the back-end by placing the wafer in pass-through chamber 106. In the system 100 of FIG. 10A, pass-through chamber 106 is only used as a hand-off location for transferring the wafer between load chamber 116 and transfer chamber 117, and accordingly is not configured as a cooling station. From pass-through chamber 106, the wafer is transferred to a PVD titanium/titanium nitride module (process module 103B, 103C, or 103F) in the back-end. There, a layer of titanium (e.g., ~250 Angstroms) is deposited on the wafer by PVD. While still in the PVD titanium/titanium nitride module, a layer of titanium nitride (e.g., ~500 Angstrom) is deposited on the wafer also by PVD. From the PVD titanium/titanium nitride module, the wafer is transferred to pass-through chamber 106 for hand-off, and transferred back to its cassette on the loading station 115 via a load lock 107. The wafer is cooled in the load lock 107 while the load lock is vented to atmosphere.

TABLE 5

WAFER TRANSFER PATH FOR THE SYSTEM OF FIG. 10A (1) Loading Station 115A or 115B
(2) Load Lock 107A or 107B
(3) Degas Module (Intermediate Process Module 104A or 104B)
(4) Pre-Clean (Process Module 103A or 103G)
(5) Central Pass-Through Chamber 106 (Hand-off only)
(6) PVD Titanium/Titanium Nitride (Process Module 103B, 103C, or 103F)
(7) Central Pass-Through Chamber 106 (Hand-off only)
(8) Load Lock 107A or 107B
(9) Loading Station 115A or 115B (wherever the wafer's cassette is)

Another way of depositing an adhesion layer of titanium and a barrier layer of titanium nitride on a wafer is illustrated with reference to the system 100 of FIG. 10B and the wafer transfer path of Table 6. A wafer is transferred from a loading station 115, to a load lock 107, and then to a degas module (intermediate process module 104A or 104B). From the degas module, the surface of the wafer is prepared in a pre-clean module (process module 103A). Thereafter, the wafer is transferred to a PVD titanium module (process module 103G), where an adhesion layer of titanium is deposited on the wafer. The wafer is then transferred to the back-end by placing the wafer in pass-through chamber 106. In the system 100 of FIG. 10B, pass-through chamber 106 is only used as a hand-off location for transferring the wafer between load chamber 116 and transfer chamber 117, and accordingly is not configured as a cooling station. Further, transfer chamber 117 in this embodiment is capable of Hi-Lo operation. From pass-through chamber 106, the wafer is transferred to a CVD titanium nitride module (process module 103B, 103C, or 103E) in the back-end. There, a layer of titanium nitride is deposited on the wafer by CVD. From the CVD titanium nitride module, the wafer is transferred to pass-through chamber 106 for hand-off, and transferred back to its cassette on the loading station 115 via a load lock 107. The wafer is cooled in the load lock 107 while the load lock is vented to atmosphere.

TABLE 6

WAFER TRANSFER PATH FOR THE SYSTEM OF FIG. 10B (1) Loading Station 115A or 115B
(2) Load Lock 107A or 107B
(3) Degas Module (Intermediate Process Module 104A or 104B)
(4) Pre-Clean (Process Module 103A)
(5) PVD Titanium (Process Module 103G)
(6) Central Pass-Through Chamber 106 (Hand-off only)
(7) CVD Titanium Nitride (Process Module 103B, 103C, or 103E)
(8) Central Pass-Through Chamber 106 (Hand-off only)
(9) Load Lock 107A or 107B
(10) Loading Station 115A or 115B (wherever the wafer's cassette is)

A method, system, and associated apparatus for high throughput semiconductor processing applications have been disclosed. While specific embodiments have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A wafer processing system comprising:
a load lock having a pedestal configured to lift a single wafer from a plurality of pins to support only the single wafer during a pump down of the load lock, the pedestal being an only wafer support located within the load lock, the load lock having an integral cooling unit for cooling the single wafer, the load lock being separated from a load chamber by a closeable opening that faces a vacuum robot in the load chamber;
a transport module having the load chamber, a transfer chamber, and a pass-through chamber located between the load chamber and the transfer chamber, the load chamber being coupled to the load lock;
an intermediate process module coupled to the load chamber and the transfer chamber;
a loader configured to receive a removable cassette containing a plurality of wafers to be processed;
an atmospheric robot configured to transfer a wafer between the load lock and the loader, the atmospheric robot being under atmospheric pressure during normal operation;
a first set of process modules coupled to the load chamber; and
a second set of process modules coupled to the transfer chamber.

2. The system of claim 1 wherein a process module in the first set of process modules includes a pre-clean module.

3. The system of claim 1 wherein a process module in the first set of process modules includes a physical vapor deposition module.

4. The system of claim 1 wherein a process module in the first set of process modules includes a chemical vapor deposition module.

5. The system of claim 1 wherein a process module in the second set of process modules includes a pre-clean module.

6. The system of claim 1 wherein a process module in the second set of process modules includes a chemical vapor deposition module.

7. The system of claim 1 wherein a process module in the second set of process modules includes a physical vapor deposition module.

8. The system of claim 1 wherein the intermediate process module is configured as a CVD module.

9. The system of claim 1 wherein the intermediate process module is configured as a degas module.

10. The system of claim 1 wherein the pass-through chamber is configured as a cooling station.

11. The system of claim 1 wherein the intermediate process module is configured as a pre-clean module.

12. The system of claim 1 wherein the intermediate process module is configured as a PVD module.

13. A wafer processing system comprising:
a load lock having only one pedestal for supporting a wafer thereon during a pump down of the load lock, the pedestal having only one wafer support for supporting only one wafer at a time, the pedestal being configured to lift a wafer from a plurality of pins, the load lock being separated from a first chamber by a closeable opening;

a transport module having the first chamber, a second chamber, and a pass-through chamber between the first chamber and the second chamber, the first chamber being coupled to the load lock by way of the closeable opening;

a loader configured to receive a removable cassette containing a plurality of wafers to be processed;

a first robot configured to transfer a wafer between the load lock and the loader, the first robot being under atmospheric pressure during normal operation;

an intermediate process module coupled to the first chamber;

a first process module coupled to the first chamber;

a second process module coupled to the second chamber;

a second robot configured to transfer a wafer between the load lock and the pass-through chamber, the second robot being under vacuum during normal operation in the first chamber and facing the closeable opening; and a third robot configured to transfer a wafer between the pass-through chamber and the second process module, the third robot being under vacuum during normal operation.

14. The system of claim 13 wherein the pedestal is water-cooled.

15. The system of claim 13 wherein the intermediate process module is also coupled to the second chamber.

16. The system of claim 13 wherein the pass-through chamber is configured as a cooling station.

* * * * *